United States Patent [19]

Dingwall

[11] Patent Number: 4,633,222
[45] Date of Patent: Dec. 30, 1986

[54] CLOCK SHAPING CIRCUIT AND METHOD

[75] Inventor: Andrew G. F. Dingwall, Bridgewater Township, Somerset County, N.J.

[73] Assignee: RCA Corporation, Princeton, N.J.

[21] Appl. No.: 782,579

[22] Filed: Oct. 1, 1985

[51] Int. Cl.⁴ .............................................. H03K 13/02
[52] U.S. Cl. ............................... 340/347 SH; 307/353; 328/151; 340/347 AD; 340/347 M; 364/178; 364/179; 358/138
[58] Field of Search ................. 340/347 AD, 347 SH, 340/347 M; 328/151; 307/353; 364/178, 179; 358/138

[56] References Cited

U.S. PATENT DOCUMENTS 3,781,871  12/1973  Mattern ....................... 340/347 AD Primary Examiner—T. J. Sloyan
Attorney, Agent, or Firm—Joseph S. Tripoli; Henry I. Schanzer

[57] ABSTRACT

Clock shaping means responsive to the frequency of an incoming clock signal ($CL_I$) produce asymmetrical clocking signals whose high to low ratio varies as a function of the frequency of $CL_I$. The asymmetrical clocking signals when applied to A/D converters, improve their performance and extend their operating range as a function of frequency.

11 Claims, 10 Drawing Figures

CLOCK SHAPING CIRCUIT AND METHOD

This invention relates to circuitry for controlling the duty cycle of an incoming clock signal ($CL_I$) whose frequency (f) may vary over a wide range.

Systems responsive to a clock signal often require operations to occur on both phases of each clock cycle; that is, when the clock signal is relatively positive (high) as well as when the clock signal is relatively negative (low). An example of such systems are analog-to-digital (A/D) converters. Typically, in A/D converters an unknown analog input voltage is "sampled" during one phase (i.e. sample phase) of each clock cycle. The "sampled" signal is then compared to a reference voltage and converted to a digital signal during a second phase (i.e. conversion phase) of each clock cycle. During the conversion phase many housekeeping tasks must also be performed to ready the system for the next sampling phase.

In prior art circuitry, the tendency is to apply a symmetrical (square or sine) wave to the A/D converter whereby the sampling period ($T_S$) is equal to the conversion (processing and housekeeping) period ($T_C$). Applicant discovered that the application of a symmetrical wave to an A/D converter to sample the unknown input voltage does not yield the best results for a large portion of the frequency spectrum. A problem exists because the frequency (f) of the input clock signal applied to the system is normally selected by the user and may vary over a very wide range. At high frequencies, the time (T=1/f) available during each cycle decreases and becomes insufficient to perform certain necessary functions without significant errors, and at low frequencies too much time may be available enabling extraneous and noise pulses to infiltrate the system. This is illustrated by reference to FIG. 2 in which curves A and B indicate the error level of a typical A/D converter operated with a symmetrical (square) wave sampling signal of frequency, f, whereby the sampling and conversion periods are each equal to 1/2f. By contrast, curve C of FIG. 2 indicates the error level of the same A/D converter when operated, in accordance with the invention, with an asymmetrical sampling period ($T_S$) defined by curve segments A, B and C of FIG. 3.

Symmetrical clock signals, tending to maintain $T_S$ equal to $T_C$, impose severe restrictions on the operation of the converter at low and high clock frequencies. An A/D converter normally includes a comparator to whose input an unknown input voltage is applied during the sampling phase. At low frequencies, if the sampling period is wide enough to allow extensive variations in the amplitude of the input voltage, the comparator, which is normally driven to its toggle point prior to sampling, will tend to be driven into saturation and then back out of saturation. The comparator may not be able to follow all these variations, particularly where the comparator is comprised of several cascaded stages. As a result, for symmetrical operation, there is an increase in the error level at low frequencies as shown in curve A of FIG. 2. For this reason, in circuits embodying the invention, the sampling interval is limited at low frequencies, between 0 Hz and $F_{B1}$ as shown by curve Segment A of FIG. 3, to a fixed value, $T_{s1}$, which is not excessively longer than the minimum time ($T_M$) needed to accurately sense or capture the value of the unknown input voltage being measured.

In the mid and high frequency range, Applicant discovered and recognized that, due to the number and type of functions being performed during the conversion period, applying a symmetrical (square) sampling signal to an A/D converter, whereby the sampling period equaled the conversion period, produced an error response, as a function of frequency, of the type shown in curve B of FIG. 2. Applicant further discovered that if the conversion period, $T_C$, decreased below some minimum value, $T_{cM}$, the error level increased relatively sharply. On the other hand, Applicant discovered that controlled shortening of the sampling period, $T_S$, below some minimum value, $T_{sM}$, did not cause the error level to increase as sharply. Applicant's invention resides in:

(1) The recognition that the operation of an A-to-D converter could be improved by means of applying asymmetrical clock signals thereto and favoring the conversion period at the expense of the sampling period;

(2) Clock shaping circuitry for producing asymmetrical signals; and (3) A-to-D converters in which the clock shaping circuits are used for generated asymmetrical sampling and conversion periods.

Clock shaping circuits embodying the invention include means, responsive to the frequency of an incoming clock signal, for producing asymmetrical signal sampling and conversion clock signals for lengthening the duration of the conversion period ($T_C$) and correspondingly shortening the duration of the signal sampling period ($T_S$).

In particular, circuits embodying the invention include clock shaping means responsive to the frequency, f, of an arbitrary incoming clock signal, $CL_I$, for producing an asymmetrical sampling clock signal ($CL_S$) and generating a sampling interval, $T_S$, which is: (a) fixed at a value of $T_{s1}$ for all frequencies of $CL_I$ below a first break frequency, $F_{B1}$, where $T_{s1}$ is less than $1/(2 \cdot F_{B1})$, and; (b) made to vary as $1/(2 \cdot f)$ minus some preselected value for frequencies of $CL_I$ extending above $F_{B1}$.

In a particular A/D converter embodying the invention there is also included means responsive to the frequency of the incoming clock signal for producing sampling and conversion clocking signals tending to maintain $T_C$ approximately equal to $T_{cM}$ and $T_S = T - T_{cM}$ at frequencies above a second break frequency, $F_{B2}$, which is above $F_{B1}$. By way of example, an A/D converter embodying the circuit of the invention, was operated with a sampling period ($T_S$) which varied as per curve segments A, B and C of FIG. 3 where $T_C$ equals [$T - T_S$], to produce the improved performance, exhibited by curve C FIG. 2.

The invention may be better understood by reference to the accompanying drawing, in which like reference characters denote like components, and in which.

Figure 4:
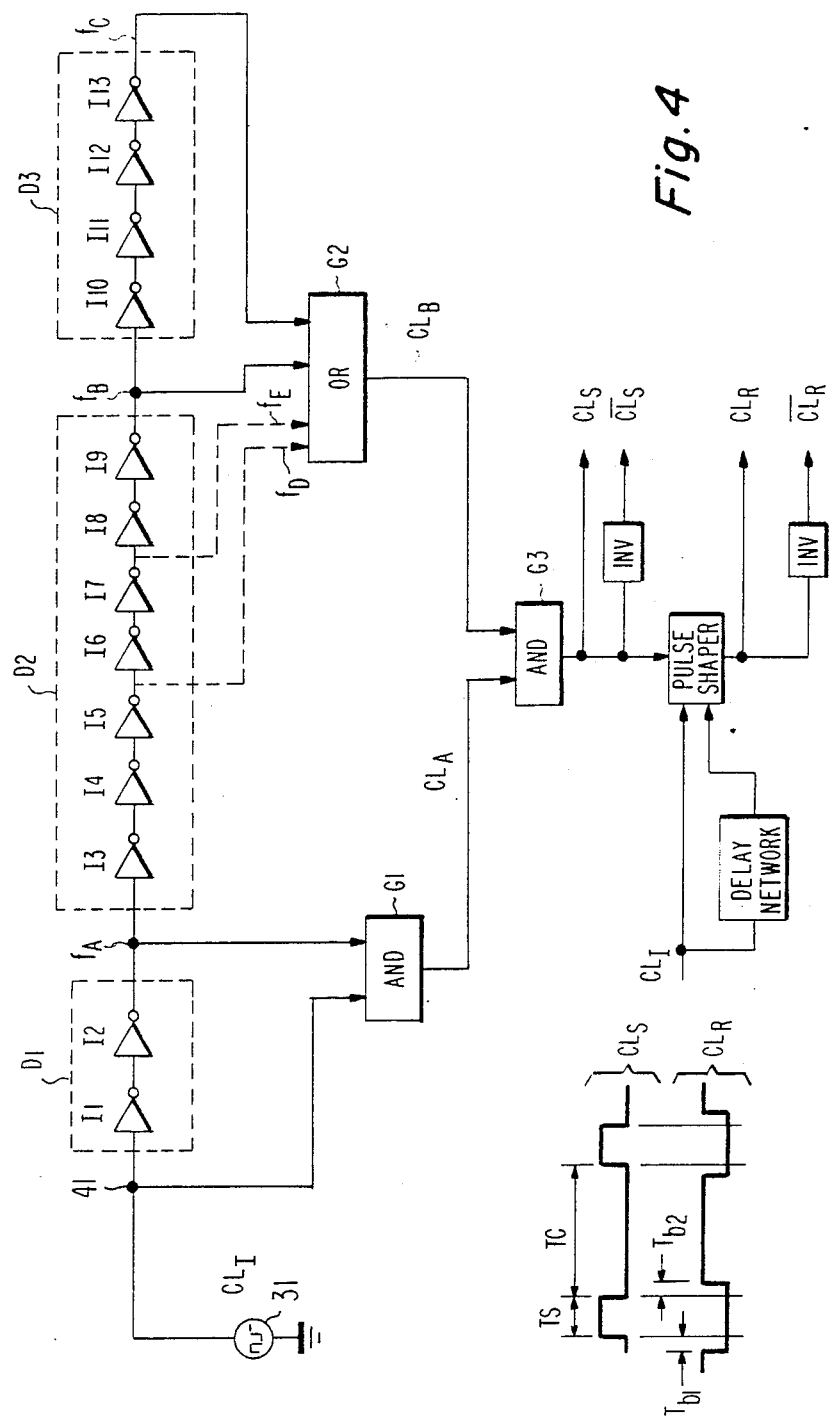
FIG. 4 is a simplified schematic diagram of a clock shaping circuit embodying the invention.

In the discussion to follow, the incoming clock signal, $CL_I$, is assumed to be symmetrical, as shown in FIG. 5, and is applied to a clock shaping circuit, as shown in FIG. 4, to produce, among others, an asymmetrical signal sampling clock signal, $CL_S$, which determines the length of the sampling period. The time (duration) during which $CL_I$ is at its high, or relatively positive, level is identified as $T_H$; the time (duration) during which $CL_I$ is at its low, or relatively negative, level is identified as $T_L$. The period, T, of one full cycle of $CL_I$ is equal to 1/f which is equal to $T_H+T_L$; where f is the frequency of the incoming clock $CL_I$. The time (duration) during which $CL_S$ (derived from $CL_I$) is at its high, or relatively positive, level is identified as $T_S$ (i.e., the signal sampling interval). The time during which $CL_S$ is at its low, or relatively negative, level is identified as $T_C$ (i.e., the signal conversion interval). The period, T, of one full cycle of $CL_S$ is equal to the period of $CL_I$. Therefore, throughout the discussion to follow $T=T_S+T_C$. The duty cycle (D) of $CL_S$ is arbitrarily defined as the ratio of the duration of the positive period ($T_S$) to the total clock period (T). In A/D converter circuits embodying the invention, $T_S$ tends to be made less than 1/(2·f), and hence to have a duty cycle which is less than 50%.

In the detailed discussion of the invention to follow, we will first discuss the operation of typical comparator circuitry formed in A/D converters, examine certain problems and then the conditions needed to improve the operation.

Figure 1A:
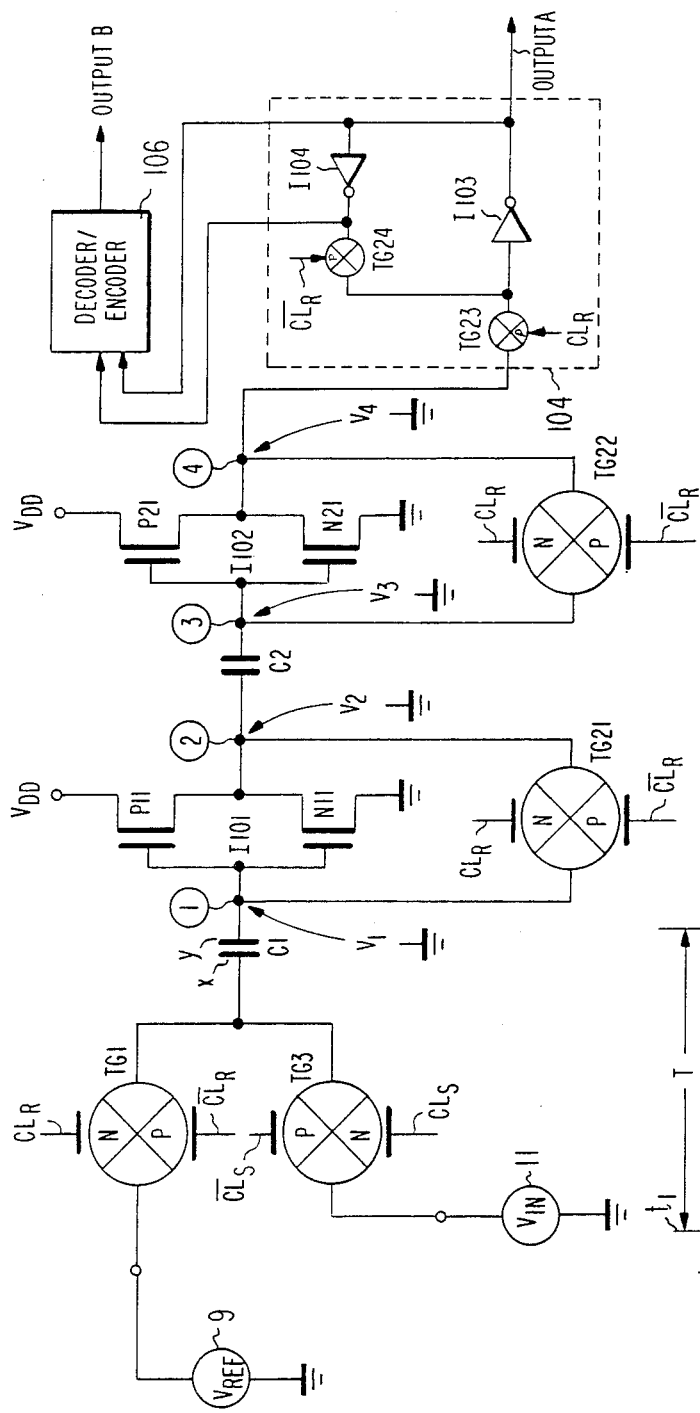
FIG. 1A is a schematic diagram of part of the comparator circuitry of an analog-to-digital (A/D) converter to be operated in accordance with the invention.

The circuit of FIG. 1A, which shows part of the comparator section of an A/D converter includes a complementary transmission gate TG1, which is turned-on and off by means of clock signals $CL_R$ and $\overline{CL_R}$, for selectively coupling a reference voltage source 9 of amplitude $V_{REF}$ to the "input" side (i.e. plate X) of a capacitor C1. A complementary transmission gate TG3, which is turned-on and off by means of clock signals $CL_S$ and $\overline{CL_S}$, is used to selectively couple a source 11 of input signal, $V_{IN}$, to be sampled, to the input side of C1. The output side (i.e. plate Y) of C1 is connected to the input of an inverter I101 at node 1. Inverter I101 includes two insulated-gate field-effect transistors (IGFETs) P11 and N11, of complementary conductivity type, having their source electrodes connected to $V_{DD}$ and ground, respectively, their gate electrodes connected to inverter input node 1, and their drains connected to inverter output node 2. A transmission gate, TG21, is connected between nodes 1 and 2. When TG21 is enabled, the input and output of inverter I101 are connected via a low impedance path and are driven to the same potential. Inverter I101 is then driven to its "toggle" point and, for this condition, inverter I101 is referred to herein as being auto-zero'ed. The output of inverter I101 is coupled via capacitor C2 to the input of an inverter I102 comprised of complementary IGFETs P21 and N21 which are interconnected to form a complementary inverter I102 of the same type as I101. A transmission gate TG22 is connected between the input, node 3, and the output, node 4, of I102. TG21 and TG22 are concurrently enabled and disabled by means of clock signals $CL_R$ and $\overline{CL_R}$. Where the source-to-drain impedance ($Z_{P11}$) of P11 is equal to the source-to-drain impedance ($Z_{N11}$) of N11 for like bias conditions, input and output nodes, 1 and 2, of I101 are driven to $V_{DD}/2$ during the auto-zero portion of each cycle. Similarly, if the source-to-drain impedance ($Z_{P21}$) of P21 is equal to the source-to-drain impedance ($Z_{N21}$) of N21 for like bias conditions, input node 3 and output node 4 of I102 are driven to $V_{DD}/2$ during the auto-zero portion of each cycle.

The output at node 4 is applied to a latch 104 comprised of transmission gate TG23 connected between node 4 and the input of an inverter I103. The output of inverter I103 is connected to the input of inverter I104 and an input to decoder/encoder 106. The output of inverter I104 is connected to another input of decoder/encoder 106 and via transmission gate TG24 to the input of inverter I103. In the circuit of FIG. 1A, TG23 is turned-on when the $CL_R$ signal is low and is turned off when $CL_R$ is high. TG24 is turned-on when $\overline{CL_R}$ is low and is turned off when $\overline{CL_R}$ is high.

Figure 1B:
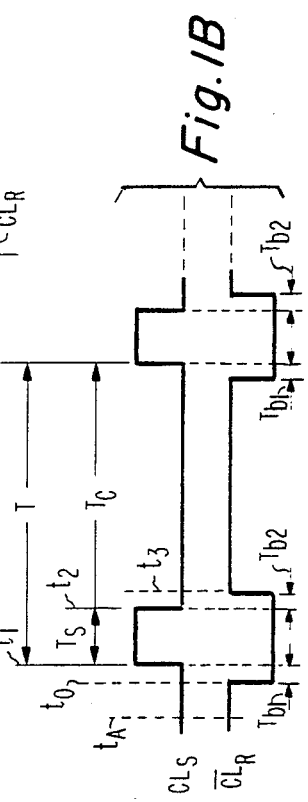
FIG. 1B is a waveform diagram of asymmetrical clock signals applied to the circuit of FIG. 1A in accordance with the invention.

One mode of operating the comparator of FIG. 1A highlighting various functions that must be performed during the sampling and conversion intervals is described below with reference to the waveforms of FIG. 1B.

(1) During each conversion interval ($T_C$), and prior to the initiation of a sampling interval, as exemplified during the time $t_A$ to $t_O$, while $CL_R$ is high ($\overline{CL_R}$ is low) and $CL_S$ is low ($\overline{CL_S}$ is high), transmission gates TG1, TG21 and TG22 are turned-on and TG3 is turned-off. As a result, inverters I101 and I102 are auto-zeroed and, assuming inverters I101 and I102 to be symmetrical, the potentials at nodes 1, 2, 3 and 4 will be driven to, or close to, $V_{DD}/2$. During this time interval, since TG1 is turned-on, reference source 9 applies the reference voltage, $V_{REF}$, to input terminal X of capacitor C1 which is thus charged to the value of $V_{REF}$.

(2) At time $t_O$, $CL_R$ goes low $\overline{CL_R}$-goes high) turning-off transmission gates TG1, TG21 and TG22. Since $CL_S$ is still low, TG3 also remains turned-off.

(3) $CL_S$ and $CL_R$ remain low for a period $T_{b1}$ extending from time $t_0$ to $t_1$. The period $T_{b1}$ is selected to be long enough to ensure that TG1 is turned-off before TG3 is turned-on. This ensures that the electrical connection between $V_{REF}$ and terminal X is "broken" before a connection is "made" between $V_{IN}$ and terminal X to prevent a short between $V_{REF}$ and $V_{IN}$.

(4) At time $t_1$, $CL_S$ goes high ($\overline{CL_S}$ goes low) and the sampling interval ($T_S$) is initiated. The input voltage ($V_{IN}$), to be sampled, is then coupled via the enabled transmission gate TG3 to the input of C1. If $V_{IN}$ is more positive than $V_{REF}$ stored on C1, a positive voltage differential ($V_{IN}-V_{REF}$) is produced at node 1 which is then amplified and inverted by I101 and further amplified and inverted by I102 to produce a "high" voltage at the output (node 4) of I102. If $V_{IN}$ is less positive than the $V_{REF}$ stored on C1, a negative voltage differential is produced at node 1 which is amplified and inverted by I101 and further amplified and inverted by I102 and a "low" voltage is produced at the output (node 4) of I102. During the sampling phase (i.e. between time $t_1$ and $t_2$) of each clock cycle, $CL_R$ remains low and transmission gates TG1, TG21 and TG22 are disabled.

(5) At time $t_2$, $CL_S$ goes low terminating the sampling interval. TG3 is turned-off breaking the connection between $V_{IN}$ and terminal X. From time $t_2$ to time $t_3$ (i.e. for a period $T_{b2}$ following $t_2$) $CL_R$ remains low whereby TG1, TG21 and TG22 remain turned-off.

(6) The period $T_{b2}$ is selected to be long enough to ensure that TG3 is turned-off and the connection between $V_{IN}$ and C1 is "broken" before TG1 is turned-on and a connection is made between $V_{REF}$ and C1. This prevents a possible short circuit between $V_{REF}$ and $V_{IN}$. In addition, during the period, $T_{b2}$, the differential voltage (i.e. $V_{IN}-V_{REF}$ or $V_{REF}-V_{IN}$) produced at node 1 during the sampling phase continues to be amplified by inverters I101 and I102 and inverters I103 and I104 in latch 104, where I103 and I104 may be of the same type as I101 and I102. During $T_{b2}$, transmission gate TG23 in latch 104 is turned-on (and TG24 is turned-off) whereby the signal at node 4 is coupled via TG23 to an inverter I103 of latch 104 which further amplifies and inverts the differential signal and applies it to an inverter I104 which also further amplifies and inverts the differential signal. Thus, the signals produced at the outputs of I101, I102, I103 and I104 continue to be driven either towards $V_{DD}$ which is arbitrarily defined as a logic "1" or towards ground potential which is arbitrarily defined as a logic "0". At the termination of $T_{b2}$, that is at time $t_3$, TG23 is turned-off and TG24 is turned-on and the amplified signal at the output of I104 is regeneratively fed back to the input of I103 causing the sampled signal information to be latched and stored into latch 104.

(7) At time $t_3$, $CL_R$ goes high with $CL_S$ being already low. When $CL_R$ goes high, TG1, TG21, TG22 and TG24 are turned-on and TG23 is turned-off with TG3 being already OFF. The turn-on of TG1 couples $V_{REF}$ to terminal X of capacitor C1. The turn-on of TG21 and TG22 cause inverters I101 and I102 to be auto-zeroed and nodes 1, 2, 3 and 4 to be driven to, or close to, $V_{DD}/2$. Independently thereof, the latched information (i.e. the output of latch 104) is fed into decoder/encoder 106. The time to perform the latching and decoding/encoding functions is generally referred to herein as $T_q$. The time, $T_q$, needed to allow the latch to reach a full logic level and to process the signal information via decoder 106 to produce a valued signal at output B may often exceed the time needed to just sample the signal or to just sample the reference voltage.

Applicant discovered that $T_q$ should not be made less than some minimum value $T_{qM}$ to prevent the introduction of uncontrolled signal errors in the processing of the signal information.

The above analysis leads to the following conclusion:

A. During each sampling interval ($T_S$), time is needed to sample the input signal ($V_{IN}$), apply $V_{IN}$ to the input of the comparator to generate a differential signal, and to amplify the differential signal by means of inverters I101, I102, I103 and I104. Applicant recognized that a minimum period of time, $T_{sM}$, is required for accurately sampling an input signal with little or no error.

B. During each conversion interval ($T_C$) time is needed to:
  a. Sample $V_{REF}$ and apply it to the input of capacitor C1;
  b. Auto-zero inverters I101 and I102;
  c. "Break" TG1 before "making" TG3;
  d. "Break" TG3 before making TG1, and also to further amplify the differential signal;
  e. Enable the information applied to latch 104 to be regeneratively fed back within the latch and the latch output to be driven to a full logic "1" or a logic "0" level; and
  f. Feed the information produced in latch 104 to encoder/decoder 106 and process (i.e. decode/encode) the information for at least a minimum period of time, $T_{qM}$.

Applicant recognized that a minimum period of time ($T_{cM}$) is required to convert the sampled input signal into meaningful data with little or no error. $T_{cM}$ includes a period $T_{rM}$, a period $T_{qM}$ and periods $T_{b1}$ and $T_{b2}$. Where: (a) $T_{rM}$, is the minimum period of time required for sampling the reference signal with little or no error. [At low frequencies (and where there is no auto-zero'ing during $T_{rM}$) it may be assumed that the the minimum period of time, $T_{rM}$, needed to accurately sample the reference signal and apply that sample to the comparator input is equal to the minimum period of time, $T_{sM}$, needed to accurately sample the input signal and apply the sample to the comparator input. At high frequencies (particularly where auto zero'ing and other housekeeping functions occur during the sampling of the reference voltage) $T_{rM}$, may no longer be assumed equal to $T_{sM}$ and may, in fact, require more time than $T_{sM}$.];

(b) $T_{qM}$ is the minimum period of time required to properly "condition" the signal; where conditioning includes amplification of the compared signal to full logic levels, the latching of that signal, and the decoding of the compared signal; and (c) $T_{b1}$ and $T_{b2}$ are as defined above.

Figure 2:
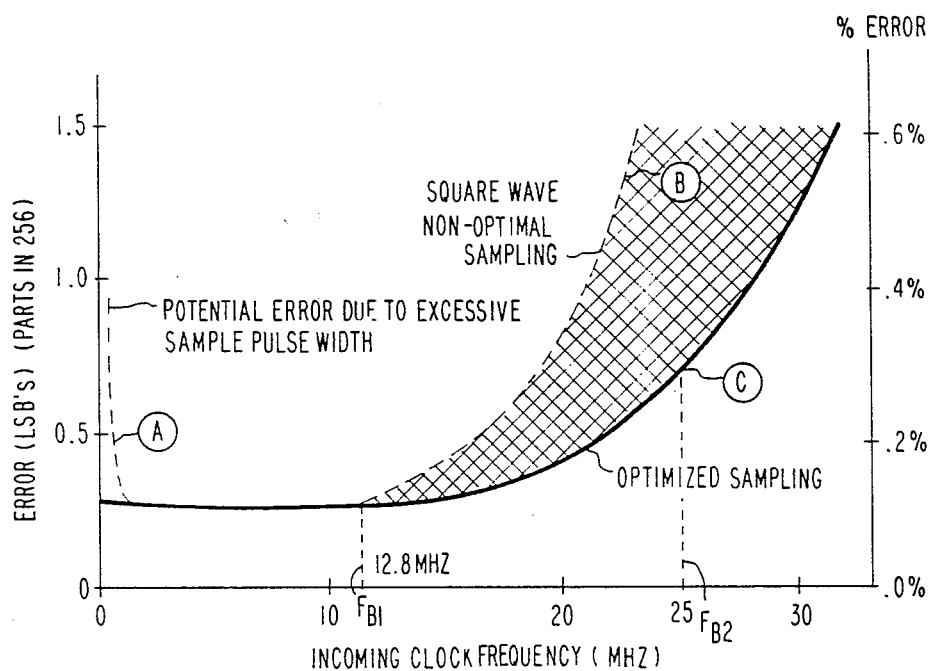
FIG. 2 is a drawing illustrating the error response of a typical analog-to-digital (A/D) converter, as a function of frequency, in response to symmetrical and asymmetrical sampling pulses.

Further analysis of the circuit of FIG. 1A reveals several problems, some already mentioned above, relating to its operation over a wide frequency range. When $V_{IN}$ is applied to the input of I101 during the sampling period, $T_S$, I101 and I102, previously auto-zero'ed and set to their toggle point, respond quickly and with amplification. I103 and I104 likewise respond quickly and with amplification. Thus, during a sampling interval, for any $V_{IN}$ greater than, or less than, $V_{REF}$, I101, I102, I103 and I104 will be driven towards, or into, saturation. Then, if $V_{IN}$ changes to a different value during the sampling interval, I101, I102, I103 and I104 may be driven in the opposite direction and may have to come out of saturation during the sampling interval. Thus, when $T_S$ is wide enough whereby the signal at the comparator input varies significantly, the comparator will tend to be driven into and out of saturation. The comparator may not be able to follow these variations, particularly where the comparator is comprised of several cascaded stages. Curve A of FIG. 2 shows the "potential" error level that may result due to "excessive" sample pulse widths at low frequencies. For this reason, at low frequencies the sampling interval should not be significantly longer than the minimum time needed to accurately sense or capture the value of the unknown input voltage being measured.

In a particular A/D converter embodying the invention, the $CL_S$ and $CL_S$ signals applied to the comparator section and other circuitry of the converter caused the $T_S$ to be set at a fixed value $T_{s1}$ of 33 nanoseconds throughout the low frequency range extending from 0Hz to the first break point, $F_{B1}$ at approximately 12.8 MHz. The potential source of error at low frequencies was substantially reduced as shown in the low frequency range of curve C in FIG. 2. The $T_{s1}$ of 33 nanoseconds was chosen to provide sufficient time margin (within the frequency range zero Hz to 12.8 MHz) to properly sample $V_{IN}$ under all conditions. The 33 nanoseconds was somewhat conservative in that it could be decreased, up to, fifty percent without significantly affecting the accuracy of the sample. Accordingly, at low frequencies (i.e. frequencies of the incoming clock ($CL_I$) significantly below $1/(T_{sM}+T_{cM})$) the sampling period ($T_S$) produced by the circuit of FIG. 4 and applied to the circuit of FIG. 1, is limited to a value of time, $T_{s1}$, which is made significantly (but not excessively) larger than $T_{sM}$ to provide sufficient margin to ensure the accurate reading of the $V_{IN}$ being sampled. Limiting the width of $T_S$ at low frequencies allows appropriate sampling of $V_{IN}$ while preventing excessive slewing of the comparator circuitry. This results in an improved (i.e. lower error level) response at low frequencies.

The mid (between $F_{B1}$ and $F_{B2}$) and high (above $F_{B2}$) frequency response of the A/D converter circuit with symmetrical $CL_S$ clocking signals is shown in curve B of FIG. 2. Evidently, the error level of the system increases sharply as the clock frequency exceeds $1/(T_{sM}+T_{cM})$. Based on the analysis of the circuit of FIG. 1A, above, Applicant recognized that at high frequencies, the minimum time needed to accurately sample and convert the sampled data is no longer available, and more time is needed to sample the reference voltage and "condition" the resulting data than to sample the input signal.

Applicant also discovered, on the basis of experiment and analysis, that if the time ($T_q$) allotted for conditioning the "compared" signal is reduced below $T_{qM}$, the error level of the resulting data output rises quickly and sharply. In contrast to results obtained when $T_q$ is reduced below $T_{qM}$, Applicant recognized and discovered that, when the sampling time, $T_S$, was reduced in a controlled manner below $T_{sM}$ and when the time to sample the reference was reduced slightly below $T_{rM}$, the error of the measured results increased in a controlled manner. Operating with a controlled error level enables the converter to be used, and to be useful, so long as the error level remains below some predetermined level. Accordingly, in the mid frequency range extending between $F_{B1}$ and a second break point frequency, $F_{B2}$, the $CL_S$ and $\overline{CL_S}$ signals applied to the comparator section and other circuitry of a particular A/D converter embodying the invention caused the $T_S$ to be set at a value equal to $[(1/2 \cdot f) - T_{DA}]$ and $T_C$ at a value equal to $[1/2 \cdot f + T_{DA}]$; where $T_{DA}$ is a constant period equal, for example, to one-half of $T_{qM}$. Decreasing $T_S$ relative to $T_C$ ensures that extra time is available during $T_C$ to properly condition the signal.

Applicant also discovered that, at high frequencies, the lowest error level was obtained when the minimum conversion period $T_C$ was not decreased below $T_{cM}$. Accordingly in the high frequency range, the A/D converter was operated with a $CL_S$ which varied such that $T_C$ was equal to $T_{cM}$ and $T_S$ was equal to $T - T_{cM}$ In brief, operating the A/D converter with sampling pulses whose widths varied as a function of frequency, as shown in curve segments A, B and C of FIG. 3 resulted in the response defined by curve C of FIG. 2.

Figure 3:
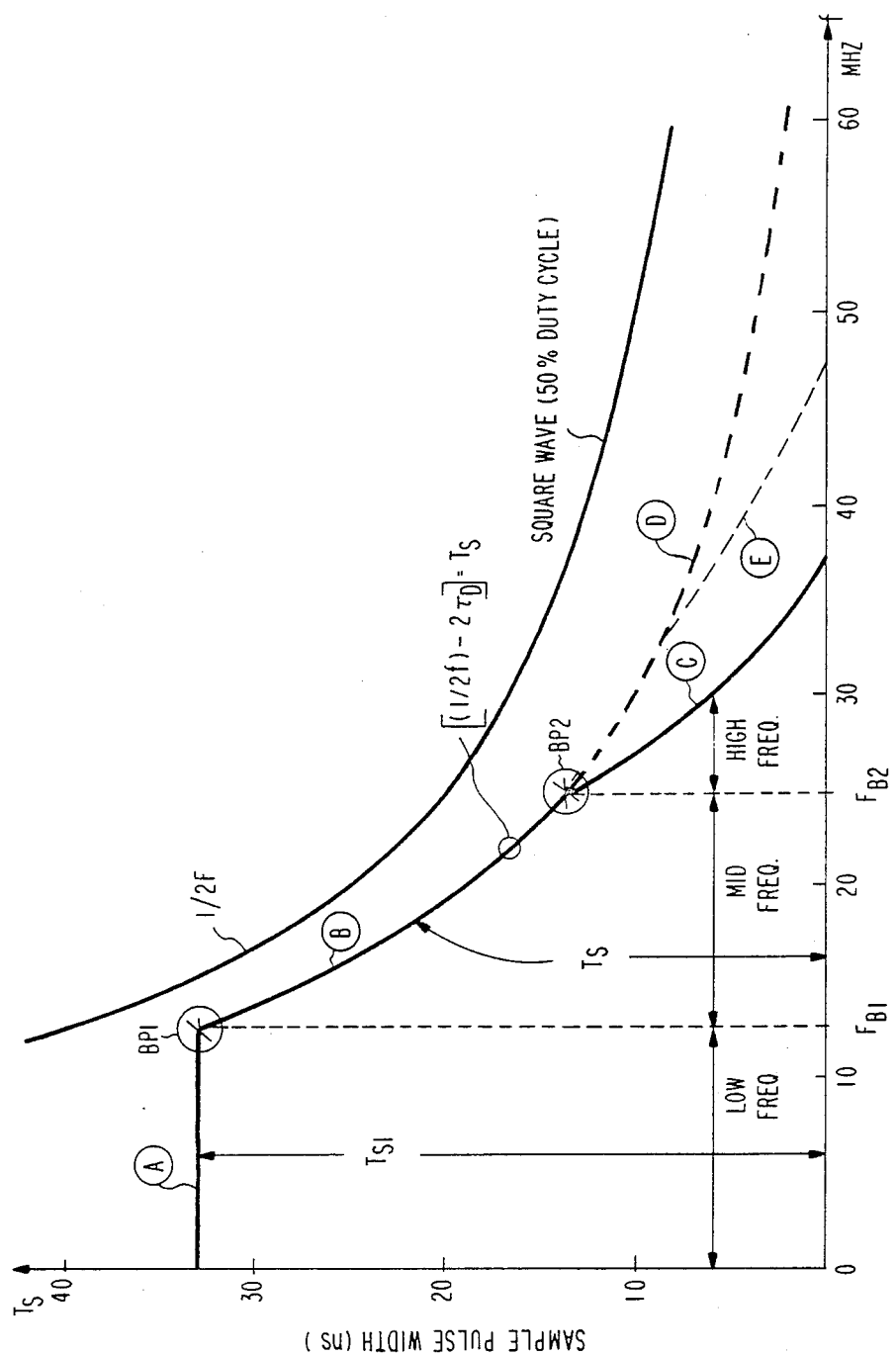
FIG. 3 is a drawing illustrating the variations in the sampling pulse width, $T_S$, applied to the A/D converter of FIG. 1, as a function of frequency, to produce the improved results of curve C of FIG. 2.

Obviously, the best results (i.e. least error at any given frequency as exhibited by curve C of FIG. 2) were obtained with the three (3) break point clock pulse system conforming to curve segments A, B and C of FIG. 3.

The simplified block diagram of a clock shaping circuit for producing clock signals for, in turn, generating sampling pulse widths whose duty cycles vary at different rates as a function of frequency, is shown in FIG. 4. As detailed below, the circuit of FIG. 4 may be used to selectively generate asymmetrical sampling and conversion signals whose pulse widths conform to those called for by the various curve segments of FIG. 3. However, the circuit of FIG. 4 could also be modified to generate other desired and/or selected pulse widths. The circuit of FIG. 4 includes an input terminal 41 to which is applied an incoming clock signal $CL_I$, supplied by a source 31, which may be assumed to be a square wave whose frequency, f, can vary, for example, from 0 Hz to more than 50 MHz. The frequency (f) of the incoming clock signal ($CL_I$) is, typically, selected by the user of the circuit. As is well known in the analog-to-digital converter art, the clock frequency should normally be, at least, twice the highest frequency component of the unknown input voltage being sampled, to satisfy the Nyquist Criteria.

The circuit of FIG. 4 includes 13 cascaded inverters (I1 through I13) arranged into 3 groups (D1, D2 and D3) to produce three different time delays. All inverters in FIG. 4 are preferably formed on the same integrated circuit (IC). When formed as part of an A/D converter, the clock shaping circuitry of FIG. 4 is preferably formed on the same IC as the circuitry forming the A/D converter to have the inverters track the other portions of the A/D converter circuitry as a function of temperature, processing and voltage variations. For purpose of illustration, in the discussion to follow, it is assumed that all the inverters in FIG. 4 are the same and that each inverter has a propagation delay ($\tau_D$) of 3 nanoseconds. Where the components of the A/D converter are comprised of complementary MOS (CMOS) devices, such as inverter I101 and I102 in FIG. 1, the inverters of FIG. 4 would likewise be, preferably, inverters of the CMOS type.

Referring to FIG. 4, the first and second inverters (I1, and I2) define a first delay network D1. A first delayed signal output, $f_A$, is taken from the output of the second inverter I2. The output $f_A$ is then AND'ed with the clock input $CL_I$ by means of an AND gate G1 to produce a first, asymmetrical, output $CL_A$. By AND'ing $CL_I$ with the delayed signal $f_A$, 6 nanoseconds (i.e. 2 $\tau_D$) are cut off from the front edge of the $CL_I$ signal to produce the asymmetrical $CL_A$ signal as shown in FIGS. 5A through 5E. The signal $CL_A$ is a rectangular wave signal which is "high" for a period $T_{H1}=(1/2 \cdot f)--2\tau_D$ and which is "low" for a period $T_{L1}=(1/2 \cdot f)+2\tau_D$; where $\tau_D$ is equal to the propagation delay of an inverter stage. For $\tau_D$ equal to 3 nanoseconds, the positive going pulse width of $CL_A$ is equal to the positive going pulse width of $CL_I$ less 6 nanoseconds; where the 6 nanoseconds represent the total propagation delay of D1, which delay is the sum of the delays of inverters I1 and I2.

A second delayed signal output, $f_B$, is produced at the output of the ninth inverter I9, seven propagation delays after $f_A$, by cascading inverters I3 through I9 which are grouped to form a delay network denoted as D2. $f_B$ is out-of-phase with the $CL_I$ and $f_A$ signals and its front edge is delayed by 7 propagation delays (e.g. 21 nanoseconds) with respect to the transitions of the $f_A$ signal.

A third delayed output signal, $f_C$, is produced, at the output of the 13th inverter I13, four (4) propagation delays after $f_B$ by cascading inverters I10 through I13 which are combined to form delay network D3.

The outputs $f_B$ and $f_C$ are OR'ed by means of OR gate G2 to produce an output $CL_B$. The output $CL_B$ is then AND'ed with $CL_A$ by means of an AND gate G3 to produce the sampling clock $CL_S$ whose positive going pulse width, $T_S$, varies as a function of frequency, as shown by curve segments A, B and C of FIG. 3. $CL_S$ is obtained from $CL_S$ via elementary inverting means. $CL_R$ is generated by combining: (1) The $CL_I$ signal and delayed versions of $CL_I$ which occur a time $T_{b1}$ before the $CL_S$ pulse goes positive; and (2) $CL_S$ and delayed versions of $CL_S$ which occur a time $T_{b2}$ after $CL_S$ goes negative. Those signals are applied to a combination of inverters and logical gates to produce a clock signal $CL_R$ which goes negative a time $T_{b1}$ before $CL_S$ goes positive and which goes positive a time $T_{b2}$ after $CL_S$ goes negative. $CL_R$ is generated from $CL_R$ by means of elementary inverters. $CL_S$ and the other clocking signals are applied to the comparators and other circuitry of the A/D converter, as shown, in part, in FIG. 1A.

Figure 5A:
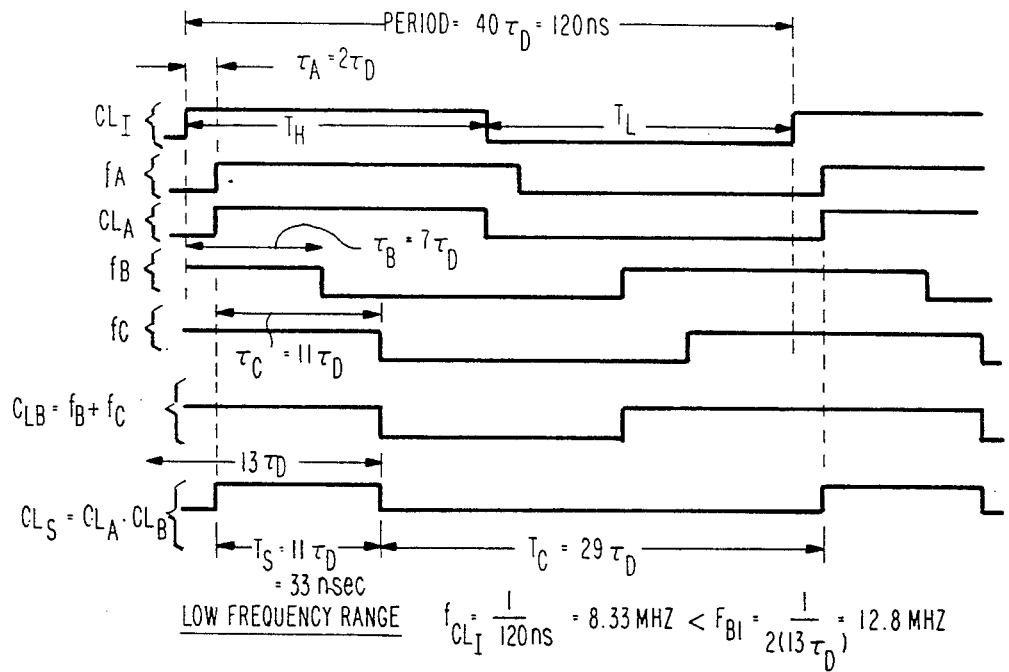
FIGS. 5A, 5B, 5C, 5D and 5E are waveform diagrams of signals produced at various points of the circuit of FIG. 4, at different frequencies.
Figure 5B:
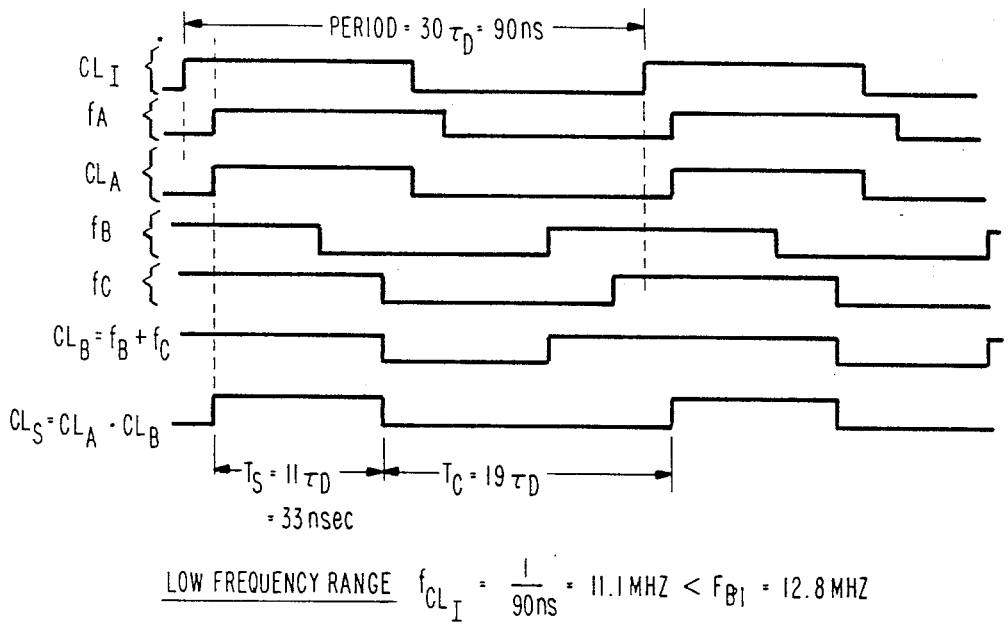

At low frequencies, below $F_{B1}$, as shown in FIGS. 5A and 5B, outputs $f_B$ and $f_C$, produced at the outputs of delay networks $D_2$ and $D_3$, are used to pare the back edge of the $CL_A$ clock to produce a sampling pulse $T_S$ having a fixed width of 11 propagation delays (i.e. the sum of delay networks $D_2$ and $D_3$). That is, $CL_B$ (which results from OR'ing $f_B$ and $f_C$) when AND'ed with $CL_A$ produces a sampling clocking signal $CL_S$ which is "high" for 11 propagation delays of each $CL_I$ cycle.

For example, when the frequency of $CL_I$ is approximately 8.33 MHz as shown in FIG. 5A or when $CL_I$ is approximately 11.1 MHz as shown in FIG. 5B, as well as for all frequencies of $CL_I$ below the first break point, $F_{B1}$,—where $F_{B1}$ is approximately 12.8 MHz—the width of $T_S$ is equal to the 11 propagation delays of I3 through I13, (i.e. delay networks $D_2$ plus $D_3$). With each propagation delay being assumed to equal 3 nanoseconds, the $T_S$ of the $CL_S$ clock is fixed; being equal to 33 nanoseconds for all frequencies below the first break point, $F_{B1}$. When applied to the A/D converter, the "high" $CL_S$ period determines the sampling pulse width ($T_S$) or sampling period with the remainder of each clock cycle (i.e., $T_C = T - T_{s1}$) being dedicated to signal conversion.

Figure 5C:
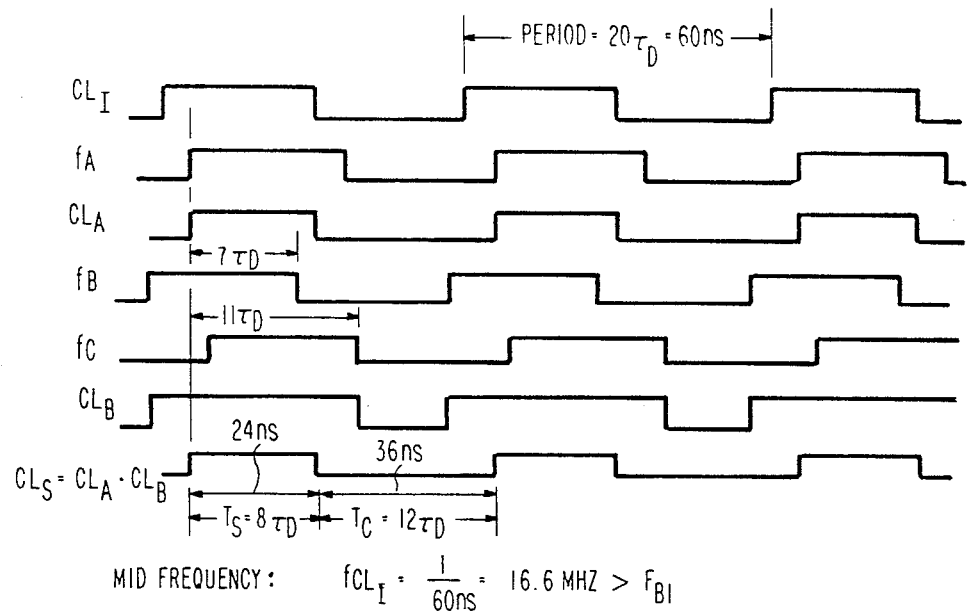
Figure 5D:
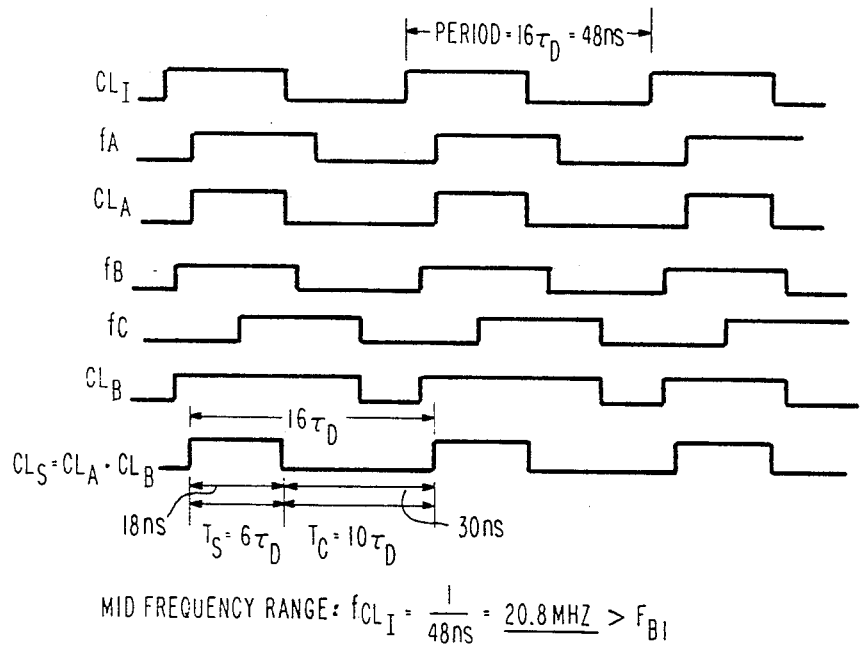

In the mid frequency range, between $F_{B1}$ and $F_{B2}$, the width of the sampling pulse, $T_S$, is less than 33 nanoseconds. In this range $CL_S$ is equal to $CL_A$ which, in turn, is equal to $CL_I$ minus $2\tau_D$. The positive going portion (i.e. $T_S$) of $CL_S$ may be expressed as $[1/(2 \cdot f) - 2\tau_D]$ and its negative going period (i.e. $T_C$) is then equal to $[(1/2 f) + 2\tau_D]$. In the mid frequency range, the delayed clocks $f_B$ and $f_C$, when OR'ed, produce a positive going clock signal $CL_B$ which brackets $CL_A$. Consequently when $CL_A$ is AND'ed with $CL_B$ to produce $CL_S$, $CL_S$ equals $CL_A$. This is illustrated in FIGS. 5C and 5D for frequencies of $CL_I$ approximately equal to 16.6 MHz and 20.8 MHz, respectively. In each instance $T_S$ is equal to $(1/2 f) - 2\tau_D$ while $T_C$ is equal to $(1/2f) + 2\tau_D$.

Figure 5E:
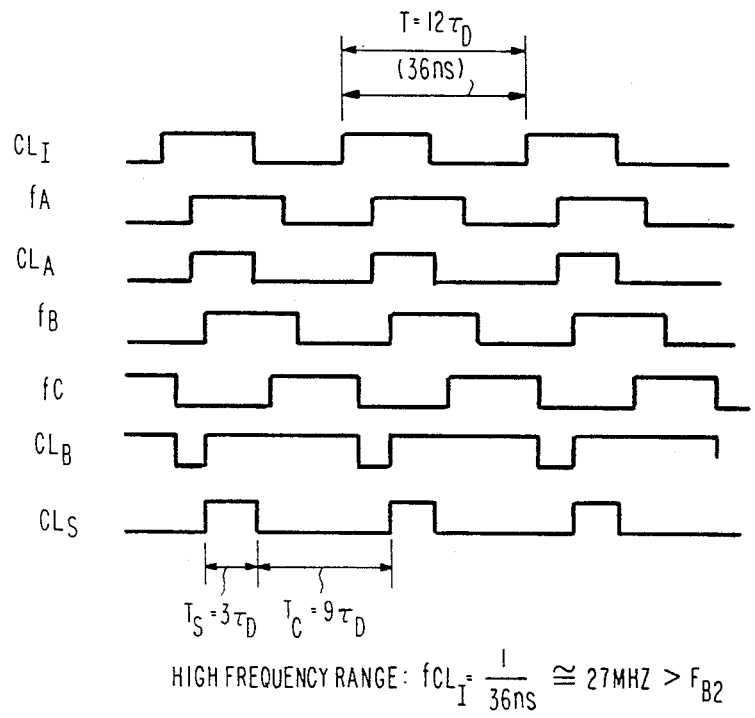

In the circuit of FIG. 4, when $f_B$ is OR'ed with $f_C$ to produce $CL_B$ which is AND'ed with $CL_A$ to produce $CL_S$, a second frequency break point $F_{B2}$ is produced above 25 MHz. Above $F_{B2}$, the ratio of $T_S$ to $T_C$ decreases sharply with increasing frequency to conform to curve segment C in FIG. 3. This causes $T_C$ to be maintained, as long as possible, approximately equal to $T_{cM}$ and $T_S$ to be equal to $T - T_{cM}$. Consequently, when the resulting clock signals are applied to an A/D converter most of the available time, during each cycle, at frequencies above $F_{B2}$, is devoted to conversion of the sampled data. At high frequencies, above $F_{B2}$, as shown in FIG. 5E, output $f_B$ and $f_C$ are used to pare the front edge of the positive going $CL_A$ clock to produce a $CL_S$ clock whose $T_S$ conforms to curve C of FIG. 3.

The application of the $CL_S$, $CL_S$, $CL_R$, and $CL_R$ signals produced by the circuit of FIG. 4 to the comparator and associated circuits. Shown, in part, in FIG. 1A whereby the sampling period $T_S$, as a function of frequency, conforms to curve segments A, B and C of FIG. 3 results in the lowest system error over the widest frequency range as shown in curve C of FIG. 2.

In the clock shaping circuit of FIG. 4, various delayed signals derived from an incoming clock signal ($CL_I$) are generated. The various delayed signals and $CL_I$ are then logically combined to produce several signals whose duty cycles have different rates in different frequency bands. Certain combinations have been detailed. However, it should be evident that other delayed signals (e.g. fD at the output of I5 and fE at the output of I7) may be derived along the delay line (D1, D2 or D3) and logically combined with other delayed outputs and/or $CL_I$ to produce other sampling curves than those shown in FIG. 3. Clearly, it is also within the ambit of the invention that the number of delay elements could also be increased or decreased.

Certain aspects of the invention may be best appreciated by examining, with the aid of some numerical examples, the result of applying some of the clock signals generated by the circuit of 4 to an A/D converter of the type shown in part in FIG. 1A. Assume, by way of example, that $T_{sM}$ is equal to 15 nanoseconds and that $T_{cM}$ is equal to 27 nanoseconds, whereby $T_{sM} + T_{cM} = 42$ nanoseconds. At low frequencies, where sufficient time exists, the minimum sampling and conversion periods may be increased by a substantial margin to minimize errors. Accordingly, at low frequencies, it is reasonable to select a fixed sampling period, $T_S$, of 33 nanoseconds as long as $T_C$ is equal to or greater than that value. Thus, in the circuit of FIG. 4 and as shown in curve segment A of FIG. 3, $T_S$ is set to have a fixed pulse width, $T_{s1}$, of 33 nanoseconds for all clock frequencies below 12.8 MHz, where 12.8 MHz defines the first break point frequency $F_{B1}$. The remaining time of each cycle is devoted to signal conversion. Although the conversion interval, $T_C$, is not shown explicitly, it is understood that $T_C$ is equal to $[T - T_S]$; where T is equal to $1/f$; and where f is the frequency of $CL_I$.

In the mid-frequency range, above $F_{B1}$ and below $F_{B2}$, the time available for sampling and conversion decreases. Assume, that in the mid-frequency range, it is desirable that the conversion period $T_C$ be greater than $T_S$ by some fixed time period. Assume, by way of example, that $T_{qM}$ is equal to 12 nanoseconds and that it is desirable that $T_C$ exceeds $T_S$ by this $T_{qM}$ of 12 nanoseconds. This is in fact accomplished by means of the circuit of FIG. 4 which, in response to $CL_I$, produces a $CL_S$ signal between $F_{B1}$ and $F_{B2}$ which results in a $T_S$ equal to $1/2f - 2\tau_D$ and $T_C$ is equal to $1/2f + \tau_D$; where $t_D$ is equal to 3 nanoseconds.

In the mid-frequency range as illustrated in FIGS. 5C and 5D values of $T_S$ (i.e. positive portion of $CL_S$) and $T_C$ (i.e. negative portion of $CL_S$) are obtained by means of the circuit of FIG. 4 assuming $T_{qM}$ to be equal to 12 nanoseconds.

When $CL_I$ is approximately 16.6 MHz, the period T of the cycle is equal to 60 nanoseconds (see FIG. 5C) which is subdivided as follows: $T_S$ is equal to 24 nanoseconds and $T_C$ is equal to 36 nanoseconds. With $T_{qM}$ equal to 12 nanoseconds the remaining conversion time for sampling the reference $V_{REF}$ and performing the other housekeeping duties is 24 nanoseconds.

When $CL_I$ is approximately 20.8 MHz, T is equal to 48 nanoseconds (see FIGS. 5D and 3) which is subdivided as follows:

$T_S$ is equal to 18 nanoseconds (i.e. 6 $\tau_D$) and $T_C$ is equal to 30 nanoseconds (i.e. 10 $\tau_D$). With $T_{qM}$ equal to 12 nanoseconds, the remaining conversion time is equal to 18 nanoseconds.

Thus, in the mid-frequency range, $T_C$ is made greater than $T_S$ by 12 nanoseconds, where the 12 nanoseconds represent the period for $T_{qM}$. By maintaining this differential "good" operation is obtained with sufficient time for data sampling and subsequent data conversion.

The high frequency operation may be better appreciated by recalling that $T_{cM}$ is assumed equal to 27 nanoseconds.

For frequencies of $CL_I$, above $F_{B2}$, the lowest error level was obtained by holding the conversion period, $T_C$, approximately equal to $T_{cM}$. That is, above $F_{B2}$, $T_{cM}$ was held relatively constant while $T_{sM}$ was reduced such that the sampling period ($T_S$) was equal to $[(1/2f) - T_{cM}]$.

To produce a sampling interval $T_S$ (and consequently a $CL_S$) conforming to curve segment C in FIG. 3, only signals $f_B$ and $f_C$ need be OR'ed in gate G2 to produce a $CL_B$ which is then AND'ed with $CL_A$ to produce the required $CL_S$. Referring to FIG. 5E, which shows typical waveforms produced by the circuit of FIG. 4 at 27 MHz (a frequency above $F_{B2}$), note that, at 27 MHz, $CL_B$ functions to cut-off, or reduce, the front end of $CL_A$ by one propagation delay (i.e. 3 nanoseconds) whereby $T_S$ is equal to 9 nanoseconds and $T_C$ is equal to 27 nanoseconds, which is equal to $T_{cM}$. At frequencies above 27 MHz, $T_C$ is held relatively constant at 27 nanoseconds (i.e. $T_{cM}$) and $T_S$ is correspondingly decreased with increasing frequencies, until $T_S$ becomes too small to provide any meaningful signal.

As noted above, the high-frequency operation of the circuit of FIG. 4 may be modified such that $T_S$ decreases more slowly than as defined by curve C of FIG. 3. For example, $T_S$ may be made to vary to conform to curve D of FIG. 3 or to some other curves, such as curve E, between curves C and D shown in FIG. 3. The pulse widths may be controlled, as shown in FIG. 4, by means of tapping various outputs from the delay networks, such as $f_D$ and $f_E$, and OR'ing these outputs with $f_B$ and $f_C$ to produce the desired $CL_S$ which in turn produces the desired sampling pulse width and conversion period.

For example, reverting to the mid-frequency examples, the circuit of FIG. 4 may be operated to ensure that $T_{qM}$ is held at 12 nanoseconds and that $T_S$ and $T_C - T_{qM}$ are equal and share the remaining cycle time. For this mode of operation, $T_S$ would vary in accordance with curve segment D of FIG. 3, which is an extension of curve segment B. Operation along curve B and D of FIG. 3 would be obtained by OR'ing signals $f_D$ and $f_E$, with signals $f_B$ and $f_C$, whereby the signal $CL_A$ is produced as $CL_S$ for frequencies above $F_{B1}$.

For this interconnection, variation of $T_S$ and $T_C$ for frequencies extending above 25 MHz may be calculated from the relationship $T_S = [(1/2f) - 2\tau_D]$ and $T_C = [(1/2f) + 2\tau_D]$ or obtained from curve segments B and D in FIG. 3. Some typical results are recorded in the table below.

| Clock Frequency | Period T in nsec. | $T_S$ in nsec. | $T_C - T_{qM}$ in nsec. | $T_{qM}$ in nsec. | $T_S/T$ Duty Cycle % |
|---|---|---|---|---|---|
| 27 MHz | 36 | 12 | 12 | 12 | 33% |
| 30 MHz | 33 | 10.5 | 10.5 | 12 | 31.8% |
| 32 MHz | 31 | 9.5 | 9.5 | 12 | 30.6% |
| 34 MHz | 29 | 8.5 | 8.5 | 12 | 29% |
| 40 MHz | 25 | 6.5 | 6.5 | 12 | 26% |
| 50 MHz | 20 | 4 | 4 | 12 | 20% |

The results indicate correspondence between the operation of the circuit of FIG. 4 and the curve segments B and D in FIG. 3. Thus, operating the system with, essentially, the signal $CL_A$ reproduced as $CL_S$ ensures that $T_S$ varies as $[1/(2f)] - 2\tau_D$ and the minimum period $T_{qM}$ is maintained while the signal and reference sampling periods ($T_C - T_{qM}$) are proportionately reduced as the frequency of $CL_I$ exceeds $F_{B1}$.

In brief, the optimum results for an A/D converter were obtained by operating the A/D converter with sampling pulses conforming to those shown in FIG. 3. To wit:

(a) In the low frequency range, from zero Hz to $F_{B1}$, $T_S$ is equal to a fixed period $T_{s1}$ (e.g. 33 nanoseconds) and $T_C$ is then equal to $1/f - T_{s1}$;

(b) In the mid-frequency range, between $F_{B1}$ and $F_{B2}$, the sampling period $T_S$ is equal to $[(1/2f) - 2\tau_D]$ and $T_C$ is equal to $[(1/2f) + 2\tau_D]$; and (c) In the high frequency range, the lowest system error was obtained by maintaining $T_C$ approximately equal to $T_{cM}$, and decreasing $T_S$ correspondingly. However, in the high frequency range, operation may be also extended, by controlling $T_S$ and $T_C$ such that $T_S$ conforms to some curve intermediate curves C and D shown in FIG. 3.

What is claimed is:

1. In an analog-to-digital (A/D) converter which requires a minimum period of time, $T_{sM}$, for accurately sampling a signal, and a minimum period of time, $T_{cM}$, for accurately converting the sampled signal into meaningful data, and wherein an incoming clock signal ($CL_I$) is applied to the converter for generating a sampling interval ($T_S$) and a conversion interval ($T_C$) during each cycle of the incoming clock signal, and wherein the incoming clock signal has a frequency, f, with a period $T = 1/f$; where f may vary over wide range, whereby T may be less than $T_{sM} + T_{cM}$, the improvement comprising:

means within said analog-to-digital converter responsive to said incoming clock signal and to its frequency for producing an asymmetrical sampling clock signal skewed in a direction to increase the ratio of the conversion interval to the sampling interval for frequencies which exceed $1/(T_{sM} + T_{cM})$.

2. In an analog-to-digital (A/D) converter which requires a minimum period of time, $T_{sM}$, for accurately sampling a signal, and a minimum period of time, $T_{cM}$, for accurately converting the sampled signal into meaningful data where $T_{cM}$ includes a data conditioning period $T_q$ which may not decrease below a minimum value $T_{qM}$ without causing significant error, and wherein an incoming clock signal ($CL_I$) is applied to the converter for generating a sampling interval ($T_S$) and a conversion interval ($T_C$) during each cycle of the incoming clock signal, and wherein the incoming clock signal has a frequency, f, with a period $T = 1/f$; and where f may vary over wide range, whereby T may be less than $T_{sM}+T_{cM}$, the improvement comprising:

clock shaping means within said analog-to-digital converter responsive to said incoming clock signal and to its frequency for skewing said incoming clock signal and producing an asymmetrical sampling clock having a sampling interval $T_S$ and a conversion interval, $T_C$, where
$T = T_S + T_C$, and where $T_S$ is equal to $(1/2f) - K_1 T_{qM}$, and $T_C$ is equal to $(1/2f) + K_1 T_{qM}$; and where f is equal to the frequency of said incoming clock signal, and $K_1$ is a constant.

3. In an analog-to-digital (A/D) converter which requires a minimum period of time, $T_{sM}$, for accurately sampling a signal, and a minimum period of time, $T_{cM}$, for accurately converting the sampled signal into meaningful data, and wherein an incoming clock signal ($CL_I$) is applied to the converter for generating a sampling interval ($T_S$) and a conversion interval ($T_C$) during each cycle of the incoming clock signal, and wherein the incoming clock signal has a frequency, f, with a period $T=1/f$; and where f may vary over wide range, whereby T may be less than $T_{sM}+T_{cM}$, the improvement comprising:

means within said analog-to-digital converter responsive to the incoming clock signal and to its frequencies which exceed $1/(T_{sM}+T_{cM})$ for producing an asymmetrical sampling clock signal having a conversion interval whose duty cycle exceeds 50% and a sampling interval whose duty cycle is less than 50%.

4. In an analog-to-digital (A/D) converter which requires a minimum period of time, $T_{sM}$, for accurately sampling a signal, and a minimum period of time, $T_{cM}$, for accurately converting the sampled signal into meaningful data, and wherein an incoming clock signal ($CL_I$) is applied to the converter for generating a sampling interval ($T_S$) and a conversion interval ($T_C$) during each cycle of the incoming clock signal, and wherein the incoming clock signal has a frequency, f, with a period $T=1/f$; and where f may vary over wide range, whereby T may have values substantially greater than $T_{sM}+T_{cM}$ and less than $T_{sM}+T_{cM}$, the improvement comprising:

means within said analog-to-digital converter responsive to the frequency of the incoming clock signal for producing an asymmetrical sampling clock signal having:

(a) for all frequencies of the incoming clock signal below $1/(T_{sM}+T_{cM})$ a sampling interval $T_S$ of fixed width $T_{s1}$, where $T_{s1}$ is sufficiently greater than $T_{sM}$ to ensure the accurate sampling of signals; and (b) for all frequencies of the incoming clock signal above $1/(T_{sM}+T_{cM})$ having a sampling interval which varies inversely as a function of said frequency f minus some preselected constant amount.

5. In an analog-to-digital (A/D) converter which requires a minimum period of time, $T_{sM}$, for accurately sampling a signal, and a minimum period of time, $T_{cM}$, for accurately converting the sampled signal into meaningful data, and wherein an incoming clock signal ($CL_I$) is applied to the converter from which a sampling interval ($T_S$) and a conversion interval ($T_C$) must be generated during each cycle of the incoming clock signal, and wherein the incoming clock signal has a frequency, f, with a period $T=1/f$; where f may vary over wide range, whereby T may be much greater and less than $T_{sM}+T_{cM}$, the improvement comprising:

means within said analog-to-digital converter responsive to said incoming clock signal and to its frequency for producing an asymmetrical sampling clock signal having:

(a) at low frequencies extending from 0 Hz to a first break frequency $F_{B1}$, a sampling interval $T_S$ whose value is fixed at a value $T_{s1}$ which is sufficiently great to ensure accurate sampling of signals;

(b) at mid-frequencies extending from said $F_{B1}$ to a second break frequency $F_{B2}$, a sampling interval $T_S$ equal to $(1/2f)-K_A$; where $K_A$ is a constant delay; and (c) at high frequencies extending above $F_{B2}$, a sampling interval $T_S$ approximately equal to $T-T_C$ where $T_C$ is equal to $T_{cM}$.

6. In an analog-to-digital (A/D) converter which requires a minimum period of time, $T_{sM}$, for accurately sampling a signal, and a minimum period of time, $T_{cM}$, for accurately converting the sampled signal into meaningful data where $T_{cM}$ includes a data conditioning period $T_q$ which may not decrease below a minimum value $T_{qM}$ without causing significant error, and wherein an incoming clock signal ($CL_I$) is applied to the converter for generating a sampling interval ($T_S$) and a conversion interval ($T_C$) during each cycle of the incoming clock signal, and wherein the incoming clock signal has a frequency, f, with a period $T=1/f$; and where f may vary over wide range, whereby T may be less than $T_{sM}+T_{cM}$, the improvement comprising:

clock shaping means within said analog-to-digital converter responsive to said incoming clock signal and to its frequency for skewing said incoming clock signal and producing a sampling clock having:

(a) for frequencies up to a first break frequency, $F_{B1}$, which is less than $1/(T_{sM}+T_{cM})$, a sampling interval $T_S$ of fixed width $T_{s1}$, where $T_{s1}$ is sufficiently greater than $T_{sM}$ to ensure the accurate sampling of signals;

(b) for frequencies which are greater than $F_{B1}$ but less than a second break frequency, $F_{B2}$, which is greater than $1/(T_{sM}+T_{cM})$ and substantially less than $1/T_{qM}$, said sampling interval $T_S$ being equal to $[(1/2f)-K_1 T_{qM}]$; where $K_1$ is a constant; and (c) for frequencies above $F_{B2}$, said sampling interval $T_S$ being equal to $[(1/2f)-K_2 T_{qM}]$; where $K_2$ is a constant.

7. The combination comprising:

a clock signal terminal adapted to receive an incoming clock signal ($CL_I$) each cycle of said incoming clock signal comprising a first period T1 during which it is relatively positive or high, and a second period, T2, during which it is relatively negative or low;

clock shaping means coupled to said clock signal terminal responsive to the frequency of said incoming clock signals for producing an asymmetrical sampling clock having:

(a) for all frequencies of said incoming clock signal below a first break frequency, $F_{B1}$, an interval $T_S$ of fixed width $T_{s1}$; and (b) for frequencies of said incoming clock signal above said first break frequency, $F_{B1}$, an interval $T_S$ which is equal to $(1/2f)$ minus a preselected constant period $T_X$, whereby $T_S$ is less than $1/2f$.

8. The combination as claimed in claim 7 wherein said clock shaping means includes delay means for producing various delayed versions of said $CL_I$ and logic gates for combining said various delayed versions of said $CL_I$ and producing said asymmetrical sampling clock.

9. The combination comprising:
a clock signal terminal adapted to receive an incoming clock signal ($CL_I$) of frequency f and period T equal to 1/f, each cycle of said $CL_I$ comprising a first period T1 during which it is relatively positive or high, and a second period, T2, during which it is relatively negative or low;
clock shaping means coupled to said clock signal terminal responsive to the frequency of said incoming clock signals for producing an asymmetrical sampling clock having:
(a) for all frequencies of said incoming clock signal below a first break frequency, $F_{B1}$, an interval $T_S$ of fixed width $T_{s1}$;
(b) for frequencies of said incoming clock signal above said first break frequency, $F_{B1}$, and below a second break frequency, $F_{B2}$, an interval $T_S$ which is equal to 1/2f minus a preselected constant period $T_X$; and
(c) for frequencies of said incoming clock signal above said second break frequencies, $F_{B2}$, an interval $T_S$ which is equal to T minus a preselected constant period $T_{cM}$.

10. The combination as claimed in claim 9 wherein said clock shaping means includes three delay networks for producing at least three different delayed signals derived from said $CL_I$ and digital gating means for combining said $CL_I$ and said at least three different delayed signals for producing said asymmetrical sampling clock.

11. The combination comprising:
a clock signal terminal adapted to receive an incoming clock signal $CL_I$ having a frequency, f, and a period T equal to 1/f each cycle of said incoming clock signal comprising a first period T1 during which it is relatively positive or high, and a second period, T2, during which it is relatively negative or low;
clock shaping means coupled to said clock signal terminal responsive to the frequency of said incoming clock signals for producing an asymmetrical sampling clock having:
(a) for all frequencies of said $CL_I$ below a first break frequency, $F_{B1}$, a positive going interval $T_S$ or fixed width $T_{s1}$ and a negative going interval $T_C$ equal to $T-T_{s1}$ where T is equal to 1/f; and
(b) for frequencies of said $CL_I$ above said first break frequency, $F_{B1}$, and below a second break frequency, $F_{B2}$, a positive going interval $T_S$ equal to $[(1/2f)-T_X]$ and a negative going interval, $T_C$, equal to $[(1/2f)+T_X]$; where $T_X$ is a preselected constant and
(c) for frequencies of said $CL_I$ above said $F_{B2}$ a negative going interval $T_C$ approximately equal to a constant $T_{cM}$ and having a positive going interval $T_S$ approximately equal to T minus $T_{cM}$.

* * * * *